United States Patent
Buijsse et al.

(10) Patent No.: US 7,301,157 B2
(45) Date of Patent: Nov. 27, 2007

(54) CLUSTER TOOL FOR MICROSCOPIC PROCESSING OF SAMPLES

(75) Inventors: Bart Buijsse, Eindhoven (NL); Mark Theo Meuwese, Eindhoven (NL); Bernardus Jacobus Marie Bormans, Eindhoven (NL); Hendrik Nicolaas Slingerland, Venlo (NL); Hendrik Gezinus Tappel, Casteren (NL)

(73) Assignee: FEI Company, Hillsboro, OR (US)

( * ) Notice: Subject to any disclaimer, the term of this patent is extended or adjusted under 35 U.S.C. 154(b) by 4 days.

(21) Appl. No.: 11/237,475

(22) Filed: Sep. 28, 2005

(65) Prior Publication Data

US 2007/0080291 A1    Apr. 12, 2007

(51) Int. Cl.
    *G01F 23/00* (2006.01)
(52) U.S. Cl. ............. 250/441.11; 250/311; 250/442.11; 356/622
(58) Field of Classification Search ................ 356/417, 356/425, 622; 250/441.11, 442.11, 307, 250/309, 311
    See application file for complete search history.

(56) References Cited

U.S. PATENT DOCUMENTS

| | | | |
|---|---|---|---|
| 2,849,619 A * | 8/1958 | Eisfeldt | ................. 250/442.11 |
| 4,080,526 A | 3/1978 | Kihara et al. | |
| 4,162,391 A * | 7/1979 | Sciaky | ................... 219/121.13 |
| 5,103,102 A | 4/1992 | Economou et al. | |
| 5,608,224 A * | 3/1997 | Alvord | ................... 250/442.11 |
| 5,641,960 A * | 6/1997 | Okubo et al. | ................ 250/310 |
| 5,852,298 A * | 12/1998 | Hatakeyama et al. | .... 250/492.2 |
| 6,396,581 B1 * | 5/2002 | Hayashi et al. | ............. 356/318 |
| 6,563,584 B1 * | 5/2003 | Yurino et al. | ................ 356/417 |
| 6,710,354 B1 | 3/2004 | Koch et al. | |
| 6,831,278 B2 * | 12/2004 | Yamamoto et al. | .... 250/441.11 |
| 6,872,955 B1 * | 3/2005 | Balcome et al. | ........ 250/440.11 |

OTHER PUBLICATIONS

C.T. Wittwer et al. "The LightCycler TM: A Microvolume Multisample Fluorimeter with Rapid Temperature Control," BioTechniques 22:176-181 (Jan. 1997).*

John L. Callas, "Minature Scanning Electron Microscope", Nov. 1999, NASA Tech Brief, vol. 23, No. 11 from JPL New Technology Report NPO-20499.

* cited by examiner

*Primary Examiner*—Jared J. Fureman
*Assistant Examiner*—Pedro A Rojas
(74) *Attorney, Agent, or Firm*—Scheinberg & Griner, LLP; Michael O. Scheinberg; David Griner

(57) ABSTRACT

A cluster tool includes multiple tools for microscopic processing of a sample positioned around a rotatable base. A sample holder on the base rotates the sample between the working areas of the tools. A slidable vacuum seal maintains a vacuum in a sample chamber for tools that require a vacuum.

18 Claims, 6 Drawing Sheets

CLUSTER TOOL FOR MICROSCOPIC PROCESSING OF SAMPLES

TECHNICAL FIELD OF THE INVENTION

The present invention relates to systems for efficient microscopic processing of samples using multiple tools.

BACKGROUND OF THE INVENTION

Samples studied in science and industry are typically subject to a variety of different processing operations including imaging, material analysis, and modifying the sample. For example, a sample may be polished, coated with carbon, and then bombarded with an electron beam in a scanning electron microscope (SEM) to analyze the sample composition and to form a magnified image. The tools that are used for these steps are typically stand-alone tools, that is, tools that are purchased separated, typically from different manufacturers, and that are not connected to each other. Thus, moving samples between tools is done manually or using awkward add-on robotics. For example, a polishing machine can be used to polish a sample. The sample is then removed from the polishing machine, cleaned, and manually placed into an evaporator for deposition of a carbon layer onto the sample. The sample is then manually removed from the evaporator and placed into an electron microscope for observation.

Besides inefficient material handling, another difficulty with using stand-alone tools is the lack of a common coordinate system. When a microscopic feature is identified on a sample in one tool, it can be time consuming to locate the same feature on a different tool. Similarly, when a measurement or analysis is performed on one tool, it can be difficult and time-consuming to correlate that information with information from a different tool. For example, it may be desirable to use a first tool to measure the topography at one spot on the sample, use a second tool to determine the composition at the same spot, and then correlate the composition data with the topography data. Because the two tools have unrelated coordinate systems, aligning the measurements from the tools can be difficult.

Some processes, such as scanning electron microscopy and focused ion beam etching, require that the sample be maintained in a vacuum in a sample chamber. The typical method for moving a sample into and out of the sample chamber is to slowly vent the chamber to the atmosphere and allow it to reach atmospheric pressure. The chamber is then opened, the previous sample is removed, a new sample inserted, and the sample chamber re-evacuated. The time required to vent the sample chamber to atmosphere and then to re-evacuate the sample chamber is significant and can preclude the use of vacuum tools in a fast-paced production line.

Several techniques have been proposed to allow a sample to be moved into or out of a vacuum chamber without opening the chamber. For example, U.S. Pat. No. 4,080,526 to Kuhara et al. for "Electron Beam Machining Apparatus of the Dynamic Seal Type" describes a dynamic seal that permits a sample to be rotated into and out of a vacuum chamber without venting the vacuum chamber to atmosphere. U.S. Pat. No. 5,103,102 to Economou et al. for "Localized Vacuum Apparatus and Method" describes a multistage non-contact vacuum seal that allows movement between the vacuum chamber and a surface under observation. Similarly, U.S. Pat. No. 6,710,354 to Koch et al. for "Scanning Electron Microscope Architecture and Related Material Handling System," describes a differentially pumped vacuum seal that provides a high vacuum in the center and successively lower vacuums toward the edge of the seal.

Another disadvantage of using stand alone tools is the expense of individual tools. A complete line of tools for sample processing, analysis, and imaging may require many expensive tools that are available only to well-funded laboratories. Still another disadvantage of using multiple stand alone tools is the amount of space required in a laboratory or a fabrication facility. Tools for microscopic processing are often located in clean rooms, and space within clean rooms is costly, both for construction and for maintaining the required cleanliness. The number of tools, and therefore the expense, can be reduced if multiple tools are combined in a single tool. Such multi-functional tools are known, but the integration of functionalities typically compromises the performance level of each of the functions.

SUMMARY OF THE INVENTION

An object of the invention is to provide a system that is adapted to efficiently process a sample using multiple tools. In a preferred embodiment, the system uses a carousel to move a sample between tools and provides reduced processing time and equipment costs.

The invention comprises a single platform that includes multiple positions for accepting a number of tools. The platform includes a carousel, that is, a rotating platform that allows for transporting one or more samples between the various tools. The tools preferably have their working areas at a fixed radius with respect to the carousel axis, so that the sample can be rapidly moved between the working areas of the various tools. The carousel enables a sample to be rapidly processed by multiple tools by facilitating the transport of the sample between tools.

In a preferred embodiment, the sample can be rapidly transitioned from an atmospheric environment to the vacuum conditions that are required for operation of some tools. In one embodiment, one or more samples are positioned in one or more recesses in a carousel base. The tools include one or more tools that are maintained in one or more vacuum chambers, each chamber having a bottom that forms a slidable vacuum seal with the carousel base. The sample in the recess can be slid under the vacuum seal, thereby admitting the sample to the vacuum chamber without opening the chamber to the environment. The small amount of air in the recess that enters the vacuum chamber with the sample can be evacuated from the vacuum chamber relatively quickly, if necessary. The evacuation can be further expedited by using vacuum buffers, that is, pre-evacuated volumes that can suck air form the recess before it enters the vacuum chamber, or from the vacuum chamber itself.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

Figure 1:
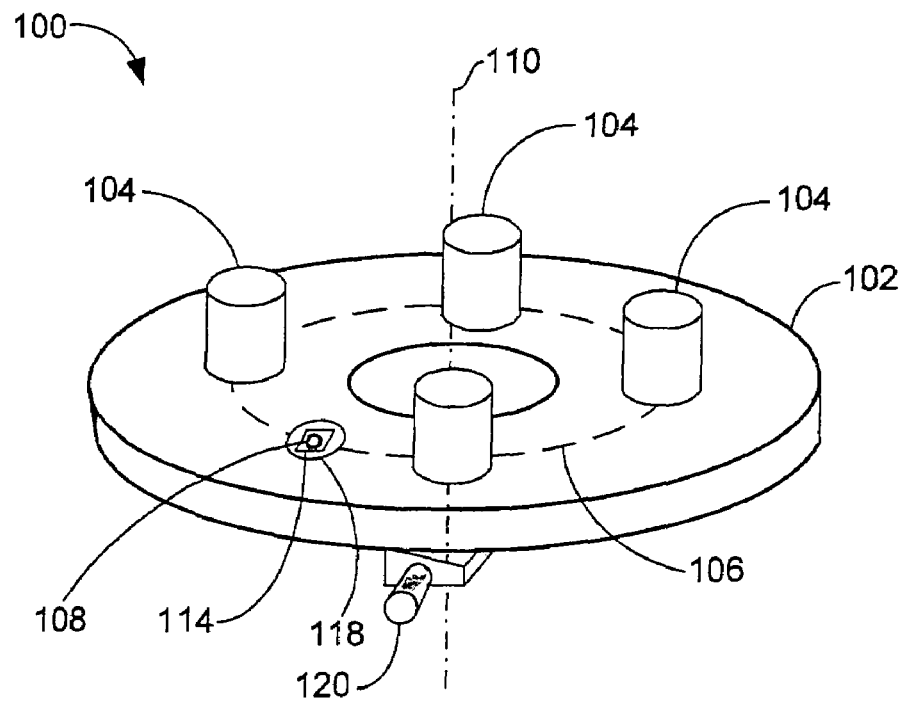
FIG. 1 shows a preferred embodiment of a cluster tool of the present invention.

FIG. 1 shows a preferred embodiment of a cluster system 100 of the present invention. System 100 includes a rotatable sample platform, referred to as a carousel 102, above which multiple tools 104 are mounted around a circle 106 for processing one or more samples 108. Carousel 102 is preferably rotated using an electric motor with feedback for precise rotation. The carousel can also be precisely positioned using notches, detents, or other means to indicate, and maintain the carousel at, the desired angular position. The tools 104 are supported on non-rotating supports (not shown) adjacent the carousel 102, for example, resting on the floor, resting on a non-rotating table top, or suspended from above the carousel, so that the carousel 102 can rotate a sample between the tools 104. A sample to be processed is supported on the rotatable carousel. The tools are typically tools used for microscopic processing of samples, that is, tools that image or alter the sample on a scale of smaller than a millimeter, more preferably smaller than 100 microns, or smaller than 10 microns.

Each tool 104 typically has a limited working area within which the sample must be positioned to be processed by the tool. Tools 104 are mounted so that the working areas of all tools 104 are located on circle 106, which is centered substantially on a carousel rotation axis 110. Thus, one can move the sample from the working area of one tool to the working area of another tool by rotating the carousel. The sample 108 on the carousel 104 is preferably mounted on a manipulator 114 that can move the sample radially and preferably provides fine adjustment circumferentially and vertically. The sample 108 and manipulator 114 can be positioned in a recess 118 in carousel 102 to facilitate moving the sample into and out of certain tools 104.

While FIG. 1 shows a single sample 108 and manipulator 114, carousel 102 can include positions for multiple samples, the multiple sample positions preferably spaced around the carousel at the same relative angular displacements as the tools, thereby permitting multiple tools to operate on multiple samples simultaneously. A micrometer spindle 120 allows fine adjustment of the angular position of axis of rotation 110. When multiple sample positions are used and multiple tools are used simultaneously, micrometer spindle cannot be used to adjust individual sample positions, because it will move all samples on the carousel at the same time. If multiple samples are used, individual sample positions can be adjusted by using individual sample manipulators 114 at each sample position. In another embodiment, the tools themselves can be moved to adjust their working areas to the sample location, instead of moving the sample to a fixed working area of the tool. Any combination of the adjusting position of the carousel, the individual sample, and individual tools can be used.

By facilitating the transition between tools 104, system 100 reduces the need for multi-functional tools, which typically compromises the performance in each of its functions. Each tool can be one link in the chain of processing, including analyzing, imaging, altering, or other operations. The invention does not exclude the use of combination tools as part of system 100. Some of the tools 104 may include sample vacuum chambers and require the sample to be maintained in a vacuum for operation. In such cases, it is preferable to minimize the time required to evacuate the sample chamber, to reduce overall processing time.

Typical tools that can be used with system 100 include imaging tools, such as light microscopes, scanning probe microscopes (such as atomic force microscopes, scanning tunneling microscopes and stylus nanoprofilometers), and electron microscopes; analytical tools such as X-ray fluorescence or raman spectrometers; mechanical processing tools, for example, for coating, polishing, cutting, or indenting; and illumination tools, such as for ultra violet curing. The invention is not limited to any specific tools. To reduce the overall cost of the system, the tools can be relatively low-cost tools, typically desktop versions of more expensive high-end systems. Costs can also be reduced by providing common support utilities for the tools, such as providing vacuum lines to multiple tools from a common vacuum source and power to multiple tools from a common power supply.

Embodiments of the invention can facilitate processing by the various tools by providing a single sample coordinate system, thereby facilitating correlation of information from the individual tools. For example, a tangent to the circle 106 at each tool can be defined as the X-axis of that tool, and a radius at that tool can be defined as the Y-axis. The carousel is rotated until a specified point on the sample is positioned at the point x=0, y=0 on each tool that is used, thereby providing a common coordinate system.

The invention reduces the time between successive process steps on different tools. Some samples change over time. For example, a process that exposes a surface may allow the surface to begin to oxidize. By facilitating rapid transition between tools, time dependent sample changes between operations are reduced or eliminated.

Figure 2:
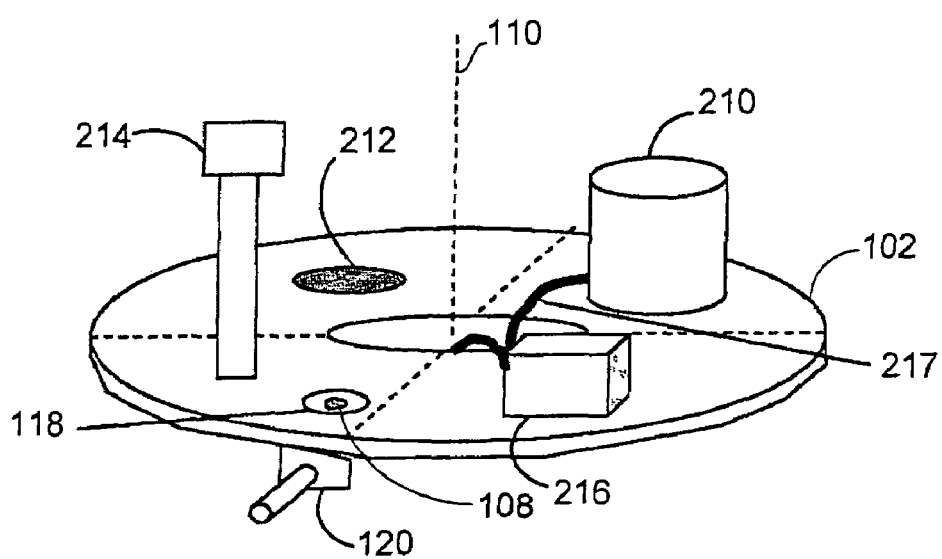
FIG. 2 shows an embodiment of the tool of FIG. 1 having specified tools mounted thereon.

FIG. 2 shows the embodiment of FIG. 1 with specific tools placed around carousel 102. The tools include a desktop scanning electron microscope (SEM) 210, a polishing machine 212, a light microscope 214 and an X-ray fluorescence (XRF) tool 216. The tools are supported in such a manner that carousel 102 is free to rotate under the tools. The SEM could be, for example, one described by John Callas in "Miniature Scanning Electron Microscope," NASA Tech Briefs, Vol. 23, No. 11, and Jet Propulsion Laboratories (JPL) Report No. NPO20499. The polishing machine 212 and the light microscope 214 operate on the sample 108 in atmosphere. The SEM 210 and XRF tool 216 require that the sample be maintained in a vacuum during processing. Vacuum lines 217 are used to evacuate sample chambers of the SEM 210 and XRF tool 216. While the tools shown in FIG. 2 are representative, the invention is not limited to those particular tools.

SEM 210 requires a vacuum of about $10^{-5}$ mbar. Loading a sample into an SEM and removing the air from the SEM to achieve the required vacuum takes time. Strategies that reduce the time required to evacuate the chamber can significantly reduce processing time.

Figure 3:
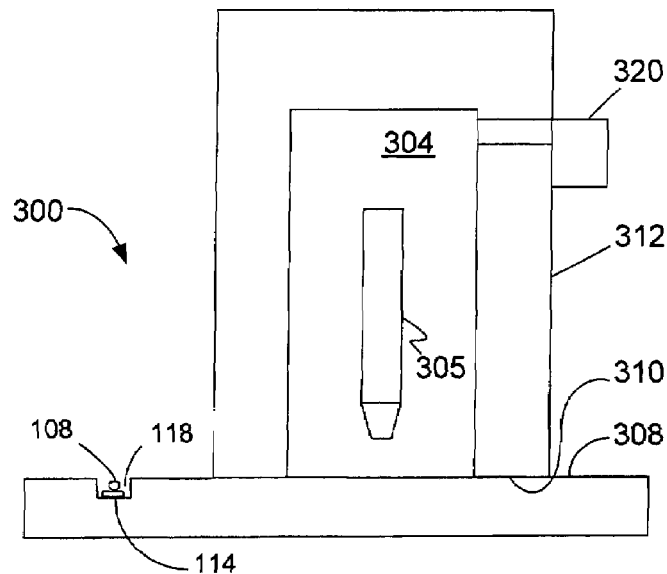
FIG. 3 shows a tool within a vacuum chamber having a sliding bearing seal to facilitate moving the sample into the vacuum chamber.

FIG. 3 shows an apparatus 300 that permits the sample 108 to be moved into a vacuum chamber, such as a vacuum chamber 304 of an SEM 305, without opening vacuum chamber 304 to atmosphere. The sample 108 is positioned in a recess 118 in a base 308. Base 308 is sufficiently flat to form a vacuum seal with a sliding bearing surface 310 of vacuum chamber 304. Base 308 can be, for example, a ground steel flat surface. Vacuum chamber 304 includes walls 312 that terminate in sliding bearing surfaces 310. Sliding bearing surfaces 310 can be integral to walls 312 or can be attached to walls 312. Sliding bearing surfaces 310 are sufficiently flat to form a vacuum seal with base 308, and can be made, for example, of steel, ceramic, or other material that can be made sufficiently flat and rigid. To reduce the friction coefficient of the combined surfaces, a coating, such as, for example, polytetrafluoroethylene (PTFE), more commonly known by its trademarked name TEFLON™, can optionally be used on one of the surfaces 308 or 310. The flatness of the two surfaces is used to create a vacuum-tight seal, typically without requiring the use of 0-rings or other elastic vacuum seals. The reduced friction coefficient is used to enable movement of the vacuum chamber 304 relative to base 308 despite the high vacuum forces. A vacuum pump 320 is used to evacuate chamber 304. For example, in one embodiment, a vacuum of $5\times10^{-2}$ mbar was achieved with a 2 to 3 liter/hour pumping speed on a vacuum chamber surface of 130 mm by 50 mm. Frictional forces were found to be less than 15 N. While grease and oil may be used as lubricants in some embodiments, such lubricants are potential sources of contamination.

Apparatus 300 can be used with system 100 (FIG. 1). Carousel 102, or a portion thereof, can be made sufficiently smooth to function as base 308. Vacuum chamber 304 is held in a fixed position, and carousel 102 is rotated beneath chamber 304. As described above, various types of sliding vacuum seals are known and can be used. Carousel 102 is pressed with sufficient force against the bottom vacuum chamber walls 312 to maintain a vacuum seal.

Figure 4:
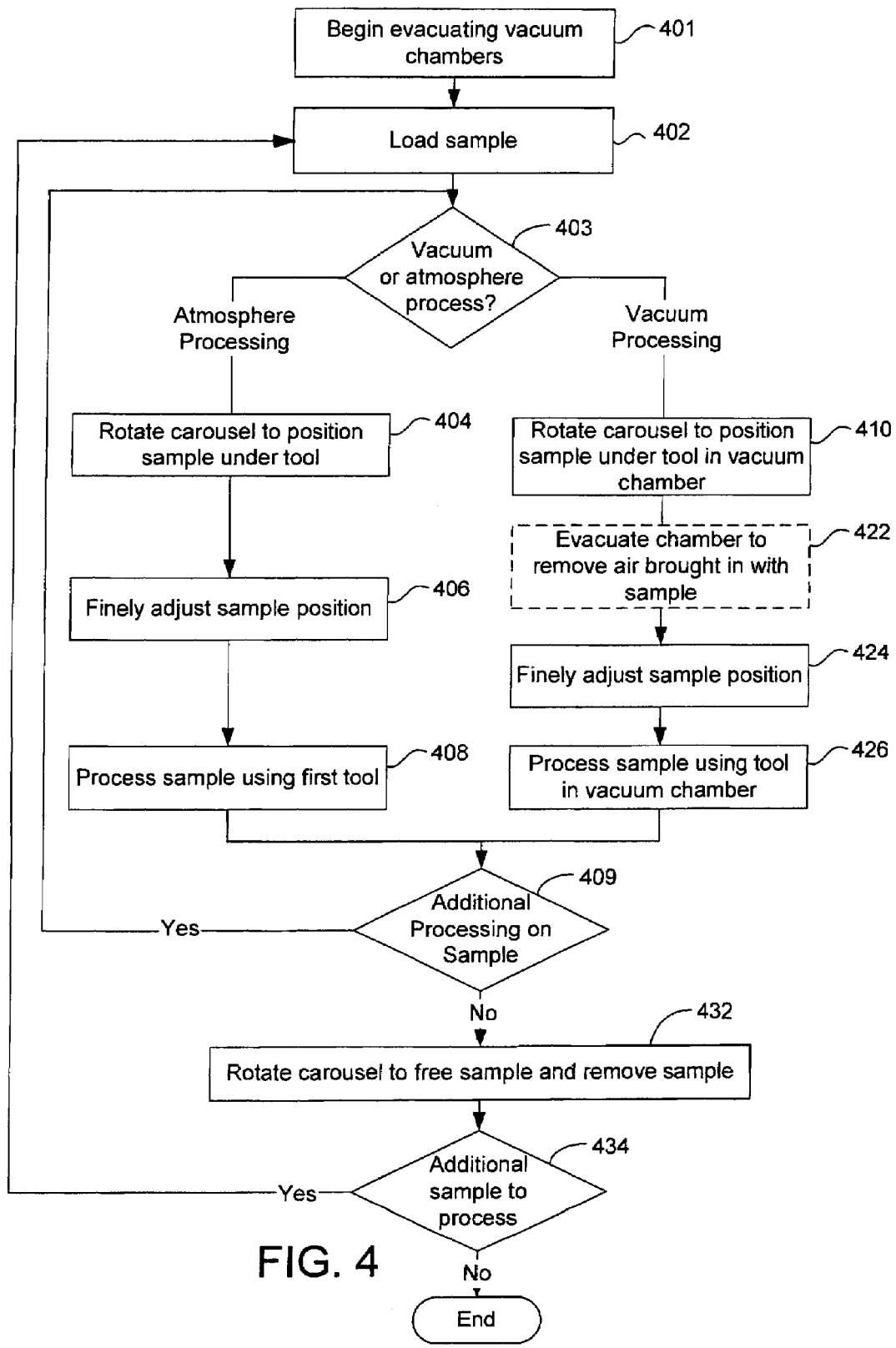
FIG. 4 is a flow chart showing the steps of using a preferred embodiment of the invention.

FIG. 4 shows the steps for performing operations on a sample using a tool that processes the sample in atmosphere and a tool that processes the sample in a vacuum. The system of FIG. 3 is used as an example of a tool that processes the sample in a vacuum in the process described below, but the invention is not limited to any specific tool or order of processing between vacuum, atmospheric, and other environmental systems, nor is the invention limited to any particular tools.

In step 401, evacuation of a vacuum chamber 304 of a tool 300 is begun. In step 402, a sample is loaded onto carousel 102. Multiple samples could be loaded for simultaneous processing, but processing a single sample is described to facilitate understanding of the process. Those of ordinary skill in the art can readily extend the description below to make and use a multiple sample embodiment. Because of the vacuum tight seal between base 308 and sliding bearing surface 310 on carousel 102, the sample can be moved around the carousel and processed by other tools concurrently with, or after, evacuating vacuum chamber 304.

Decision block 403 indicates that the next steps depend on whether the next processing step is performed in a vacuum or in atmosphere. If the next processing step is performed in atmosphere, the carousel 102 is rotated in step 404 to position the sample 108 within the working area of a first tool.

In step 406, the position of the sample is adjusted, manually or automatically, in the radial direction and vertically using manipulator 114. The sample position can be adjusted in the circumferential direction either by adjusting the rotational position of carousel 102 using the micrometer 120, or by using manipulator 114. In step 408, the tool processes the sample. For example, the tool may be an optical microscope for observing and recording an image of the sample, or a polishing machine to polish the sample.

Decision block 409 determines whether additional processing of the sample is required. If so, the process returns to step 403 to determine whether the additional processing is vacuum processing or atmosphere processing. If the additional processing is vacuum processing, the carousel is rotated in step 410 to bring the sample into vacuum chamber 304. To reduce processing time, the evacuation of chamber 304 is preferably complete before the sample 108 enters into the chamber 304. As the carousel 102 is rotated, chamber 304 slides over recess 118 in which sample 108 is located, and the sample 108 thereby enters the chamber 304.

Although chamber 304 was evacuated prior to rotating sample 108 into chamber 304, air in recess 118 enters chamber 304 as sample 108 is rotated into chamber 304, increasing the pressure in chamber 304. Depending upon the vacuum requirements of the tool in the vacuum chamber, it may be necessary to further evacuate the chamber to remove the air that entered the chamber along with the sample. Because only a relatively small amount of air enters, the time required to evacuate the chamber to the required operating pressure is typically much shorter than the time required to evacuate the chamber from atmospheric pressure. In optional step 422, chamber 304 is evacuated. In step 424, the position of the sample 108 is finely adjusted as described above. In step 426, tool 104 processes the sample. Environmental scanning electron microscopes, which operate at a higher pressure than conventional electron microscopes, can be used as a tool in the invention and can eliminate or further reduce evacuation time.

Decision block 409 again determined whether additional processing is required on the sample. If so, the processing continues with decision block 403. If no additional operation is required by systems positioned around carousel 102, the carousel is rotated to free the sample and the sample is removed in step 432. Because the bearing contact area between base 308 (as embodied by carousel 102) and sliding bearing surface 310 is preferably wider than recess 118 rotating recess 118 out from under chamber 304 allows little or no air into the chamber 304. Thus, the chamber remains evacuated and ready to use for the next sample. Vacuum pump 320 can be operated as needed to evacuate any air that leaks into chamber 304 between carousel 102 and sliding bearing surface 310. In decision block 434, it is determined whether additional samples are to be processes. If so, processing is continued by loading the next sample as shown in step 402. It will be understood that if carousel 102 includes multiple sample holders and accommodates multiple samples, a new sample can be placed and rotated to one tool, while a sample already on carousel 102 is rotated to a different tool.

Figure 6:
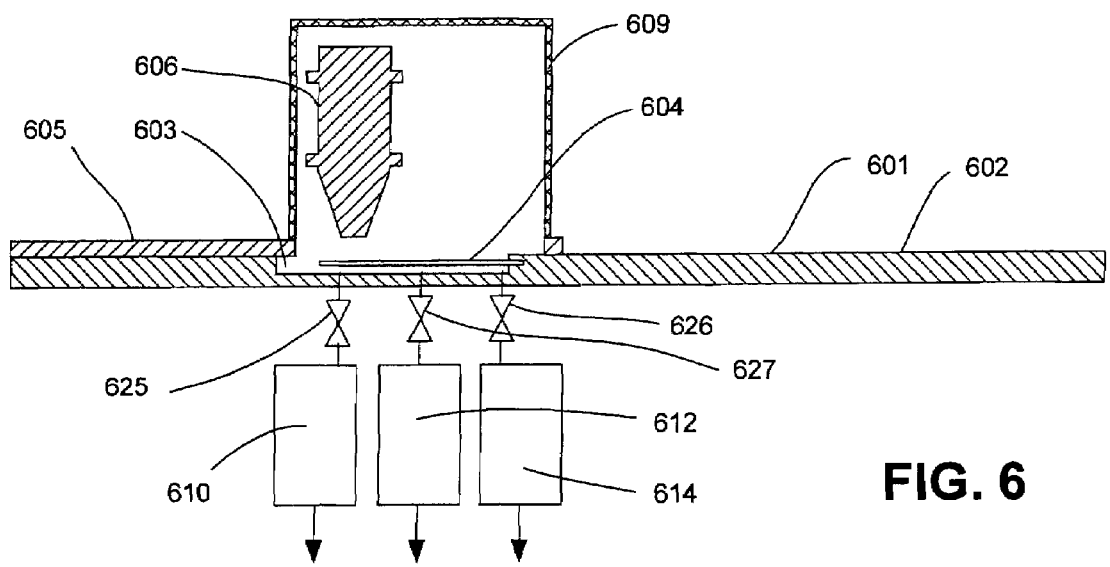
FIG. 6 shows another system for rapidly providing a vacuum environment within a chamber.
Figure 5A:
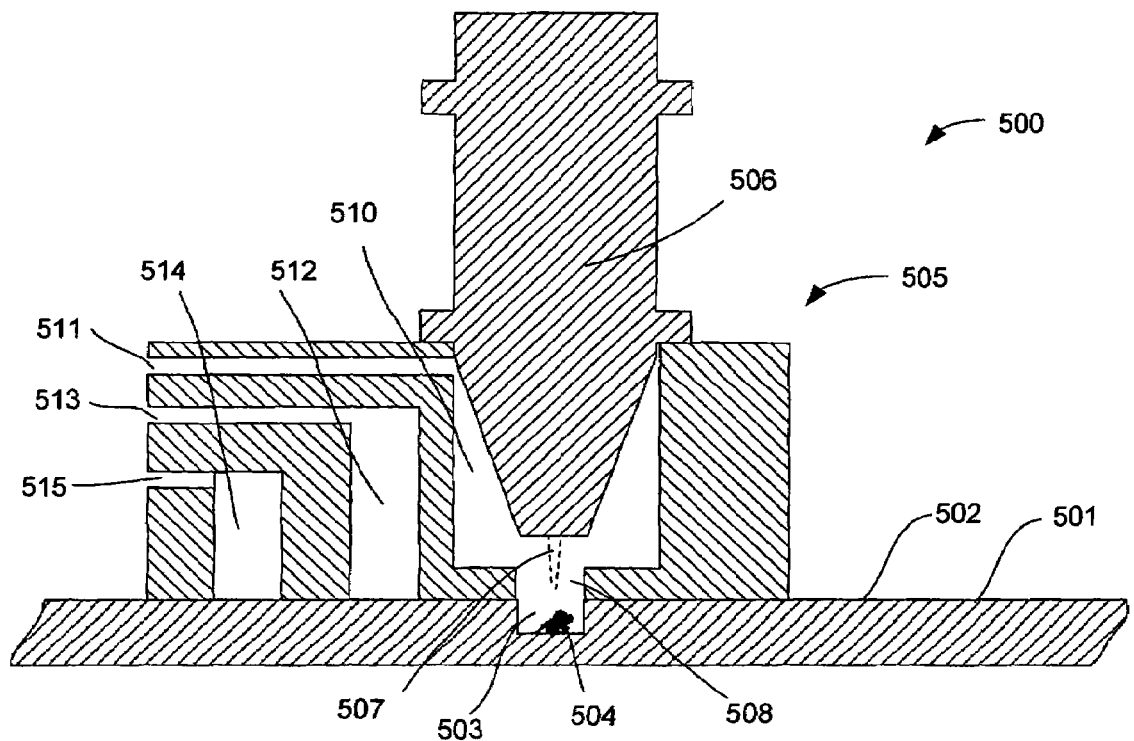
FIGS. 5A and 5B show a system for rapidly providing a vacuum environment within a chamber.
Figure 5B:
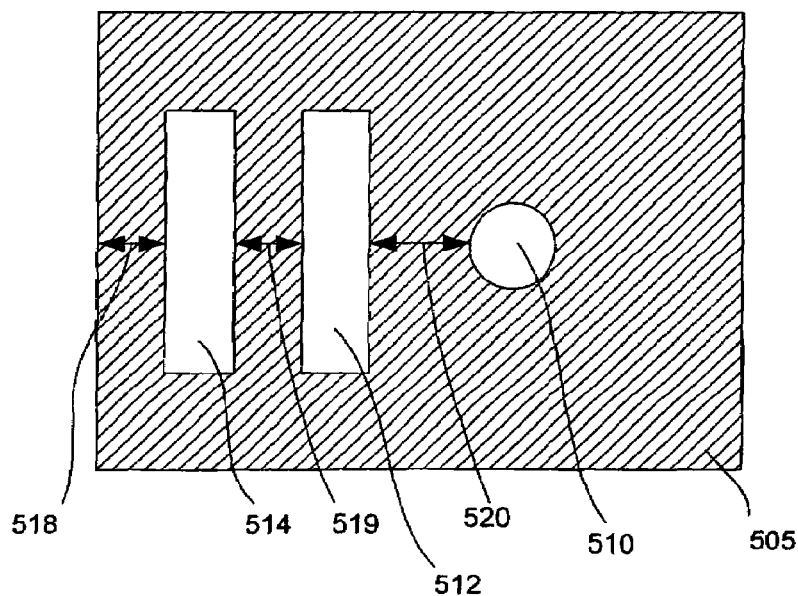

FIGS. 5A, 5B, and 6 show methods and apparatuses, which are described in U.S. patent application Ser. No. 11/169,274, for reducing the time required to evacuate a sample vacuum chamber.

FIG. 5A shows an alternative embodiment of a system 500. The depicted apparatus comprises a sheet 501 with a smooth surface 502, in which smooth surface 502 includes a hole in the form of a cavity 503 is cut out. A sample 504 is laid in this cavity 503. Sheet 501 can be a part of carousel 102. A sole plate 505 is placed on the smooth surface 502 and is movable across the smooth surface 502 in a vacuum-tight manner.

FIG. 5B schematically shows the side of the sole plate 505 that seals onto the smooth surface 502.

The sole plate 505 is provided with hollows that form vacuum buffer volumes 510, 512 and 514. These vacuum buffer volumes are connected to vacuum pumps (not shown) via the respective shafts 511, 513 and 515.

A vacuum column in the form of, for example, a column of an Environmental Scanning Electron Microscope (ESEM column) 506, which generates a focused electron beam 507, is affixed to the sole plate 505. An ESEM can analyze a sample at a pressure in the vicinity of the sample of about 10 mbar or less. The electron beam 507 produced by the ESEM column 506 probes the sample 504 through a hollow 508 in the sole plate 505. The electron beam 507 induces the emission of, for example, radiation such as secondary electrons and X-ray radiation, which can be detected with the aid of detectors (not shown).

Before introducing a sample 504, the sole plate 505 is first slid across the smooth surface 502 in such a manner that the cavity 503 is not covered by the sole plate 505. It is then easy to remove from the cavity 503 any sample that has already been analyzed, and to lay in the cavity a subsequent sample that is to be analyzed.

Next, the sole plate is slid across the smooth surface, as a result of which the cavity 503 is successively connected to vacuum buffer volumes 514, 512 and 510. The volume of the vacuum buffer volumes is a few times greater, e.g. ten times greater, than the volume of the cavity 503. When such a vacuum buffer volume is connected to the cavity 503, the pressure in the cavity will decrease almost instantaneously by a factor of, for example, ten.

In the depicted position, the pressure will hereby be reduced in three steps, each of a factor of ten, for example, so that the pressure decreases in total by a factor of $10^3$. Assuming that the pressure upon introducing the sample was 1 bar, the pressure is reduced to 1 mbar, which pressure is sufficiently low for analysis with the aid of an ESEM column (and for various other analysis techniques).

The separation 518 between the surroundings and the first vacuum buffer volume 514 is of such a size that, before the cavity 503 is connected to the first vacuum buffer volume, the cavity is completely covered. In this manner, one prevents the vacuum buffer volume 514 from being momentarily connected to ambient pressure via the cavity 503. This requires that the width of separation 518 be greater than the diameter of cavity 503.

In the same manner, the separation 519 between the first vacuum buffer volume 514 and the second vacuum buffer volume 512 has a width greater than the diameter of the cavity, just as does the separation 520 between the second vacuum buffer volume 512 and the third vacuum buffer volume 510.

In the depicted apparatus, the hollows in the sole plate 505 that form the vacuum buffer volumes 510 and 512 are asymmetrically formed. It should be clear that embodiments are also possible whereby the hollows are, for example, formed concentrically about the vacuum buffer volume 510.

It should be mentioned that, for other desired pressures, the apparatus can be equipped with a different number of vacuum buffer volumes, or one can choose a different ratio between the volume of the cavity and the size of the vacuum buffer volumes.

In the depicted apparatus, only one hole 503, in which a sample 504 can be placed, is made in the sheet 501. It should be clear that an apparatus according to the invention can be provided with a plurality of holes in which samples can be placed, whereby one or more holes can be covered by the sole plate 505. For example, it is possible to position the sole plate in such a manner that a first hole is connected to vacuum buffer volume 514, while a second hole is connected to vacuum buffer volume 512, and the third hole is connected to vacuum buffer volume 510.

It should be mentioned that it is not necessary to connect each vacuum buffer volume to a separate pump. As is known to the skilled artisan, by applying the correct pump resistances between the vacuum buffer volumes and the vacuum pump, it is possible—using only one vacuum pump—to evacuate, for example, three vacuum buffer volumes in such a manner that, when one of the vacuum buffer volumes is evacuating the cavity (whereby, of course, the pressure in the vacuum buffer volume concerned will change), the pressure in the other vacuum buffer volumes will be influenced either not at all or only to a slight extent.

FIG. 6 schematically depicts an apparatus according to the invention whereby a wafer is being analyzed by an analysis column that is movable in a vacuum column. The depicted apparatus comprises a sheet 601, which can be part of carousel 102, with a smooth surface 602, in which smooth surface 602 a hole in the form of a cavity 603 has been cut out. A sample in the form of a semiconductor wafer 604 is laid in this cavity 603. Sole plate 605 is placed on the smooth surface 602 and is movable across the smooth surface 602. Upon the sole plate 605 a vacuum column 609 is mounted, in which vacuum is maintained using non-depicted evacuation means. Within the vacuum column 609 is located an analysis column, such as an ESEM column 606, which is movable within the vacuum column 609 (with the aid of non-depicted moving means). The cavity 603 is connected to vacuum valves 625, 626, and 627 that can connect the cavity 603 to vacuum buffer volumes 610, 612 and 614. These vacuum buffer means are evacuated by (non-depicted) vacuum pumps.

Before introducing a wafer 604, the sole plate 605 is first slid across the smooth surface 602 in such a manner that the cavity 603 is not covered by the sole plate 605. The vacuum valves 625, 626, and 627 are hereby closed, so that the vacuum buffer volumes 610, 612, 614 are not in vacuum connection with the cavity 603.

After introducing the wafer 604, the sole plate 605 is slid across the smooth surface 602 in such a manner that the cavity 603 is completely covered by the sole plate 605, but there is no vacuum connection between the cavity 603 and the vacuum column 609. Thereafter, the cavity 603 is successively connected to the vacuum buffer volumes 610, 612 and 614 by opening and closing the vacuum valves 625, 626 and 627.

It should be mentioned that, in general, one of the vacuum valves 625, 626, and 627 at most will be opened, so that the vacuum buffer volumes 610, 612, and 614 will not be brought into vacuum connection with one another.

Thereafter, the sole plate 605 is slid across the smooth surface 602 in such a manner that the vacuum column 609 is positioned above the cavity 603. The ESEM column 606, which is movable within the vacuum column 609, is thereafter moved to a region of interest of the wafer 604 to be analyzed.

After the analysis, air is let into the cavity 603 by moving the sole plate 605 across the smooth surface 602 in such a manner that the cavity is no longer covered by the sole plate.

It should be mentioned that it is also possible to let air into the cavity 603 using a separate, non-depicted air inlet valve. Admission of air can occur when the sole plate 605 is slid in such a manner that the cavity 603 is still covered by the sole plate 605, but the cavity 603 is no longer in vacuum connection with the vacuum column 609.

By providing multiple tools on one platform while avoiding the performance compromises inherent of multifunctional tools, the invention provides a lower cost alternative to high performance individual machines. The lower cost of some embodiments are particularly suitable for educational institutions, low budget laboratories, industrial facilities, such as metal, chemical, pharmaceutical, forensic labs, and hospitals. While embodiments of the invention can use lower cost components, the invention is not limited to using such components.

Figure 7:
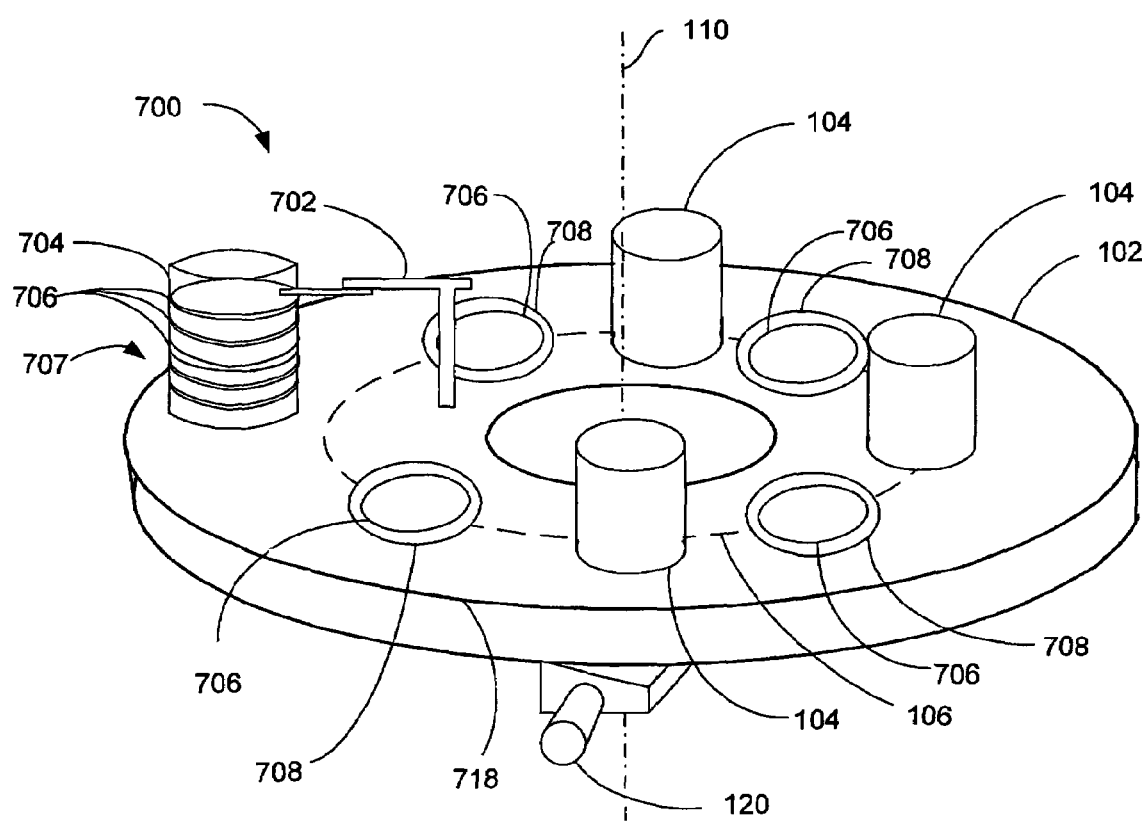
FIG. 7 shows an embodiment of the invention that uses a material handling tool.
Figure 8:
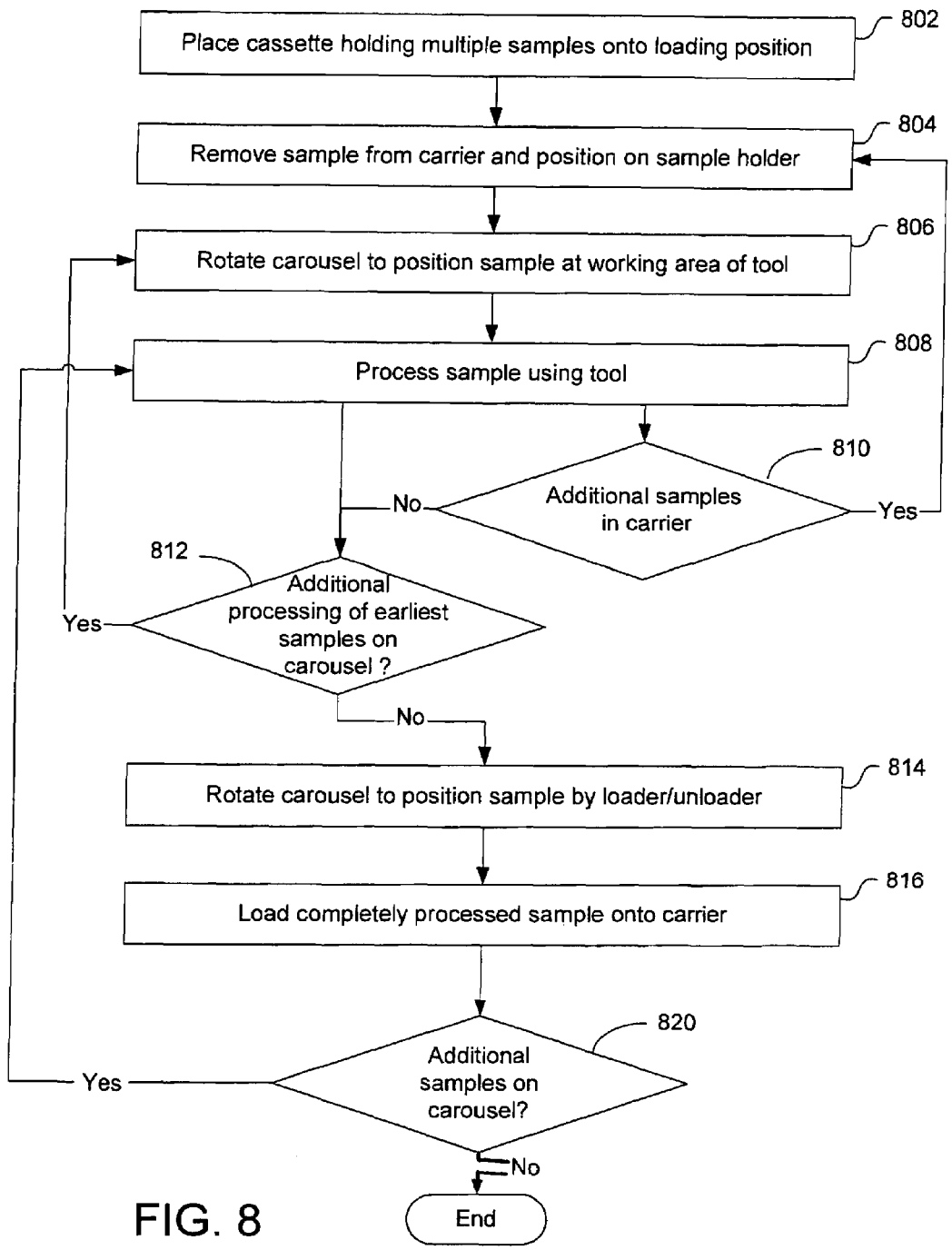
FIG. 8 is a flow chart showing the steps of using the preferred embodiment of FIG. 7.

In another embodiment, one tool about the carousel can be a material handling tool, for example, a tool that can load and unload samples from a sample carrier onto one or more sample holders on the carousel. For example, FIG. 7 shows a material handling tool, a cassette loader/unloader 702. Operation of this embodiment is described with respect to a flowchart in FIG. 8. Details of the operation, such as evacuating chambers and adjusting the workplace position, which were previously described with respect to FIG. 4, may also be performed in this embodiment, but are not described again or shown on FIG. 7.

In step 802, an operator places a carrier 704 containing multiple samples 706, such as a cassette of semiconductor wafers, at a loading position 707 near the cassette loader/unloader 702. In step 804, cassette loader/unloader 702 removes a sample 706 from the cassette and places the sample onto a sample holder 708 on carousel 102. In step 806, carousel 102 is rotated to position sample 706 within the working area of a first tool 104. In step 808, sample 706 is processed by a first tool 104. Decision block 810 shows that if there is another sample to be processed, cassette loader/unloader 702 places another sample onto the carousel 102 at the next sample holder by cassette loader/unloader 702. Steps 806 and 808 are then repeated to position and process the new sample. Decision block 812 shows that if the first sample is to be processed by an additional tool, when carousel 102 is rotated to bring the new sample into the working area of the area of the first tool, the rotation of the carousel also brings the earlier placed sample into the working area of a second tool.

These steps are repeated until each sample has been rotated completely around the turntable. In step 814, a sample that has completed processing is rotated back to a position near cassette loader/unloader 702, and in step 816 the sample is loaded by cassette loader/unloader 702 back into carrier 704 or into a second carrier. When the completed sample is rotated to the position near cassette loader/unloader 702 for loading into the carrier, any other samples remaining on the carousel are preferably simultaneously positioned under other tools at the same time. Decision block 820 shows that if there are samples still on the carousel, they are processed in step 808. After processing the samples on the carousel, any additional samples are loaded in step 810, and the processing continues until all samples have been unloaded from carrier 704, processed by all tools 104, and reloaded into carrier 704. When all samples in the carrier have been processed, the carrier can be removed and a new cassette of samples can be placed by the cassette loader/unloader 702 for processing.

The term "sample" as used herein is not limited to a representative of a population, but can include any work piece, including a product that is being fabricated using the tools in an embodiment of the invention.

In some embodiments, the working area of one or more tools may be offset from the carousel, so that the sample is moved from the carousel onto a fixed holder at the tool, thereby allowing the tool to process one sample while the carousel is rotated to transfer other samples between tools.

Although the present invention and its advantages have been described in detail, it should be understood that various changes, substitutions and alterations can be made herein without departing from the spirit and scope of the invention as defined by the appended claims. For example, in some systems, the sample may be fixed and the tools may rotate on a platform. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim:

1. An apparatus for microscopic processing of samples, including:
   a base rotatable around a rotation axis;
   multiple tools, including at least one charged particle beam tool that operates with the sample at less than atmospheric pressure, each tool including a working area, the working areas being positioned on a tool circle centered substantially on the rotation axis;
   a plurality of recesses in the base for holding samples, the recesses positioned along a base circle centered on the rotation axis and equal in diameter to the tool circle such that the base is rotatable to position the multiple recesses within the working areas of the multiple tools; and,
   a portion of the charged particle beam tool forming with the base a sliding vacuum seal such that a sample in a recess can rotate into a working area of the at least one charged particle beam tool and be maintained in a vacuum while the tool is operating.

2. The apparatus of claim 1 in which the at least one charged particle beam tool includes a scanning electron microscope.

3. The apparatus of claim 1 in which the at least one of charged particle beam tool includes a vacuum buffer cavity to facilitate providing a vacuum in the tool.

4. The apparatus of claim 1 in which at least one of the tools comprises a material handling tool.

5. The apparatus of claim 1 further comprising a positioner for positioning the sample.

6. The apparatus of claim 5 in which the positioner moves the base to position the sample.

7. The apparatus of claim 5 in which the positioner moves only an individual sample to position the sample.

8. The apparatus of claim 1 further comprising a positioner for positioning the rotating base at an angular displacement so that at least one of the plurality of recesses coincides with the working area of a tool.

9. The apparatus of claim 1 in which multiple ones of the recesses are spaced around the base circle such that multiple recesses are simultaneously positioned in the working area of multiple tools so that multiple tools can operate on multiple samples without rotating the base.

10. The apparatus of claim 9 in which the multiple tools are configured to operate on the multiple samples simultaneously.

11. The apparatus of claim 1 in which at least one of the multiple tools is configured to process a sample outside of a vacuum chamber.

12. A method of using multiple tools to perform microscopic processing on a sample, the method comprising:
provrding multiple tools, each tool having a working area, at least one of the tools requiring that the sample be positioned in a vacuum for operation;
providing a turntable having a plurality of sample recesses, the turntable rotating the sample recesses between working areas of the multiple tools, the turntable forming a vacuum seal with the tools requiring the sample to be positioned in a vacuum for operation;
placing a first sample in the sample holder;
rotating the first sample to the working area of a first one of the multiple tools;
processing the sample on the first one of the multiple tools;
placing a second sample in a second recess;
rotating the turntable to position the first sample under a second tool and the second sample under the first tool, at least one of the first and second samples being rotated into or out of a vacuum environment at the first or second tool; and
processing the first sample on the second tool and the second sample on the first tool.

13. The method of claim 12 in which processing the first or second sample on one of the multiple tools includes observing the sample using a scanning electron microscope.

14. The method of claim 12 in which processing the first or second sample on one of the multiple tools includes observing the sample using a scanning probe microscope.

15. The method of claim 12 further comprising adjusting the position of the first or second sample under one of the multiple tools to align the sample with the working area of the tool processing the sample.

16. The method of claim 15 in which adjusting the position of the sample includes adjusting the position of the turntable.

17. The method of claim 12 in which at least two of the multiple tools are configured to operate on the multiple samples simultaneously, one of the at least two multiple tools configured to operate on the corresponding sample in a vacuum and the other of the at least two multiple tools configured to operate on the corresponding samples outside of a vacuum chamber.

18. The method of claim 12 in which processing the first sample on first tool and the second sample on the second tool includes processing the first sample and the second sample simultaneously.

* * * * *

UNITED STATES PATENT AND TRADEMARK OFFICE
CERTIFICATE OF CORRECTION

PATENT NO. : 7,301,157 B2 Page 1 of 1
APPLICATION NO. : 11/237475
DATED : November 27, 2007
INVENTOR(S) : Bart Buijsse et al.

It is certified that error appears in the above-identified patent and that said Letters Patent is hereby corrected as shown below:

On the Title Page, Item (56) Other Publications, change "The LightCycler TM:...." to --The LightCycler$^{TM}$:...--

Column 5
Line 29, change "0-rings" to --o-rings--

Signed and Sealed this

Eighth Day of April, 2008

JON W. DUDAS
*Director of the United States Patent and Trademark Office*